(12) United States Patent
Kodama et al.

(10) Patent No.: US 9,578,790 B2
(45) Date of Patent: Feb. 21, 2017

(54) POWER CONVERSION APPARATUS

(75) Inventors: Katsuhisa Kodama, Chiyoda-ku (JP);
Yoshiyuki Fujii, Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 182 days.

(21) Appl. No.: 14/372,664

(22) PCT Filed: Mar. 19, 2012

(86) PCT No.: PCT/JP2012/057034
§ 371 (c)(1),
(2), (4) Date: Jul. 16, 2014

(87) PCT Pub. No.: WO2013/140502
PCT Pub. Date: Sep. 26, 2013

(65) Prior Publication Data
US 2015/0208556 A1    Jul. 23, 2015

(51) Int. Cl.
*H05K 7/20* (2006.01)
*B60L 3/00* (2006.01)
*B60L 11/18* (2006.01)
*B60L 15/00* (2006.01)
(Continued)

(52) U.S. Cl.
CPC .......... *H05K 7/20927* (2013.01); *B60L 3/003* (2013.01); *B60L 11/1812* (2013.01); *B60L 15/007* (2013.01); *H05K 7/209* (2013.01); *B60L 2210/10* (2013.01); *B60L 2210/30* (2013.01); *B60L 2210/40* (2013.01); *B60L 2240/36* (2013.01); *B60L 2240/525* (2013.01); *H01F 27/025* (2013.01); *H01F 27/105* (2013.01); *Y02T 10/645* (2013.01); *Y02T 10/7005* (2013.01); *Y02T 10/7072* (2013.01); *Y02T 10/7216* (2013.01);
(Continued)

(58) Field of Classification Search
CPC .......... H01L 23/473–23/4735; H05K 7/20254; H05K 7/20927–7/20936; H01F 27/10
See application file for complete search history.

(56) References Cited

U.S. PATENT DOCUMENTS 5,159,529 A * 10/1992 Lovgren ............ H05K 7/20636
165/185
6,588,647 B2 * 7/2003 Yamada ............ H05K 7/20872
165/170
(Continued)

FOREIGN PATENT DOCUMENTS

CN          1630076 A       6/2005
CN        102064672 A       5/2011
(Continued)

OTHER PUBLICATIONS

Communication dated Oct. 16, 2015 from the European Patent Office in counterpart application No. 12871882.2.
(Continued)

*Primary Examiner* — Robert J Hoffberg
(74) *Attorney, Agent, or Firm* — Sughrue Mion, PLLC; Richard C. Turner (57) ABSTRACT

A power converter includes: a first metal member; a second metal member to be connected to the first metal member to form a space in which a coolant flows; and a heating electric component main body to be housed in a concave portion formed on the first metal member so as to project into interior of the space.

8 Claims, 5 Drawing Sheets

(51) Int. Cl.
*H01F 27/02* (2006.01)
*H01F 27/10* (2006.01)

(52) U.S. Cl.
CPC .......... *Y02T 10/7241* (2013.01); *Y02T 90/127* (2013.01); *Y02T 90/14* (2013.01)

(56) References Cited

U.S. PATENT DOCUMENTS

| | | | | |
|---|---|---|---|---|
| 6,594,149 B2* | 7/2003 | Yamada | ............ | H05K 7/20872 165/170 |
| 6,865,080 B2* | 3/2005 | Radosevich | ............ | B60L 11/12 165/80.4 |
| 7,206,204 B2* | 4/2007 | Nakatsu | ............ | H01L 23/4006 165/80.3 |
| 7,710,723 B2* | 5/2010 | Korich | ............ | H05K 7/20927 165/104.33 |
| 7,978,471 B2* | 7/2011 | Tokuyama | ............ | H01L 23/36 165/104.33 |
| 8,064,198 B2* | 11/2011 | Higashidani | ....... | H05K 7/20927 165/104.19 |
| 8,159,823 B2* | 4/2012 | Murakami | ............ | H01L 23/473 180/243 |
| 8,169,780 B2* | 5/2012 | Yoshino | ............ | H05K 7/20927 165/104.33 |
| 8,570,132 B2* | 10/2013 | Doo | ...................... | H01F 27/025 336/90 |
| 8,730,672 B2* | 5/2014 | Ebersberger | ......... | H01L 23/473 174/15.1 |
| 9,000,553 B2* | 4/2015 | Tokuyama | ........... | H05K 7/1432 257/499 |
| 9,007,767 B2* | 4/2015 | Nakajima | ............ | H02M 7/003 165/80.4 |
| 9,042,101 B2* | 5/2015 | Tokuyama | ............ | H01L 23/36 361/704 |
| 9,137,932 B2* | 9/2015 | Tokuyama | ............ | H01L 23/36 |
| 9,147,634 B2* | 9/2015 | Kodama | ............ | H05K 7/2049 |
| 9,179,581 B2* | 11/2015 | Suwa | .................. | H05K 7/2089 |
| 9,241,429 B2* | 1/2016 | Kaneko | ................. | H02M 7/003 |
| 9,419,535 B2* | 8/2016 | Nishihara | ............. | H02M 7/003 |
| 2005/0135065 A1 | 6/2005 | Nakatsu et al. | | |
| 2005/0180106 A1* | 8/2005 | Ohashi | ...................... | F28F 1/22 361/699 |
| 2008/0117602 A1 | 5/2008 | Korich et al. | | |
| 2011/0096496 A1 | 4/2011 | Doo et al. | | |
| 2012/0211213 A1* | 8/2012 | Kitajima | ............... | H01L 23/473 165/185 |
| 2013/0128643 A1* | 5/2013 | Shinohara | .......... | H05K 7/20927 363/131 |
| 2015/0070845 A1* | 3/2015 | Hara | .................. | H05K 7/20254 361/699 |
| 2015/0146378 A1* | 5/2015 | You | .................... | H05K 7/20254 361/707 |
| 2015/0334874 A1* | 11/2015 | Rai | .................... | H05K 7/20254 361/699 |
| 2016/0007492 A1* | 1/2016 | Suwa | .................. | H05K 7/2089 361/820 |

FOREIGN PATENT DOCUMENTS

| | | |
|---|---|---|
| EP | 2787529 A1 | 10/2014 |
| JP | 08-149621 A | 6/1996 |
| JP | 3066726 B2 | 7/2000 |
| JP | 2002-198477 A | 7/2002 |
| JP | 4003719 B2 | 11/2007 |
| JP | 4218184 B2 | 2/2009 |
| JP | 2010-135369 A | 6/2010 |
| JP | 2011-29480 A | 2/2011 |
| JP | 2011-151193 A | 8/2011 |
| JP | 2011-228508 A | 11/2011 |

OTHER PUBLICATIONS

International Search Report for PCT/JP2012/057034 dated Jun. 26, 2012.
Communication dated Feb. 25, 2016, issued by the State Intellectual Property Office of the P.R.C. in corresponding Chinese Application No. 201280071613.3.

* cited by examiner

POWER CONVERSION APPARATUS

CROSS REFERENCE TO RELATED APPLICATIONS

This application is a National Stage of International Application No. PCT/JP2012/057034 filed Mar. 19, 2012, the contents of all of which are incorporated herein by reference in their entirety.

TECHNICAL FIELD

The present invention relates to a power converter, which is to be mounted on, for example, a plug-in hybrid vehicle or an electric automobile, including an electric charger for converting an input AC power supply into a direct current to charge a high-voltage battery and a DC-DC converter for converting a voltage of the high-voltage battery into a 12V-system voltage to charge an auxiliary battery.

BACKGROUND ART

Hitherto, heating electric components, such as a transformer and a reactor, which are incorporated into an in-vehicle power converter, are housed within a metal case, and are connected to other cooling components through an insulating heat-transfer sheet so as to be cooled (for example, see Patent Literature 1).

CITATION LIST

Patent Literature

[PTL 1] JP 2002-50527 A

SUMMARY OF INVENTION

Technical Problems

In the case of the in-vehicle power converter having the configuration described above, however, the number of components is large. In addition, heat generated by the heating electric components is transferred to the cooling components through the metal case and the insulating heat-transfer sheet. Therefore, a heat-transfer path is long to increase a thermal resistance. Moreover, heat-radiating surfaces are only a fin formed on the metal case, which houses the heat-generating electric components therein and a bottom surface of the metal case. Therefore, there is a problem in that the heat-radiating area is small to provide poor heat-radiating performance.

Further, there is another problem in that a temperature inside the power converter is increased by heat radiated from the fin.

The present invention has been made to solve the problems described above, and has an object to provide a power converter, which provides improved performance for radiating heat of heat-generating electric components and has a reduced number of components to improve ease of assembly.

Solution to Problems

According to one embodiment of the present invention, there is provided a power converter, including: a first metal member; a second metal member to be connected to the first metal member to form a space in which a coolant flows; and a heating electric component main body to be housed in a concave portion formed on the first metal member so as to project into interior of the space.

Advantageous Effects of Invention

According to the power converter of the present invention, the heating electric component main bodies are embedded in the concave portions of the first metal component, and hence are surrounded by the space in which the coolant flows, through the concave portions therebetween. As a result, the heat-radiating area is increased to improve performance for radiating heat of the heating electric component main bodies.

In addition, the concave portions of the first metal component also serve as reservoirs of heating electric components, which respectively house the heating electric component main bodies. Therefore, the number of components is reduced to shorten a heat-transfer path between the coolant and the heating electric component main bodies. As a result, a thermal resistance value is reduced.

DESCRIPTION OF EMBODIMENTS

Referring to the accompanying drawings, an in-vehicle power converter according to each of embodiments of the present invention is described below. In the drawings, the same or corresponding components and parts are denoted by the same reference symbols.

First Embodiment

Figure 1:
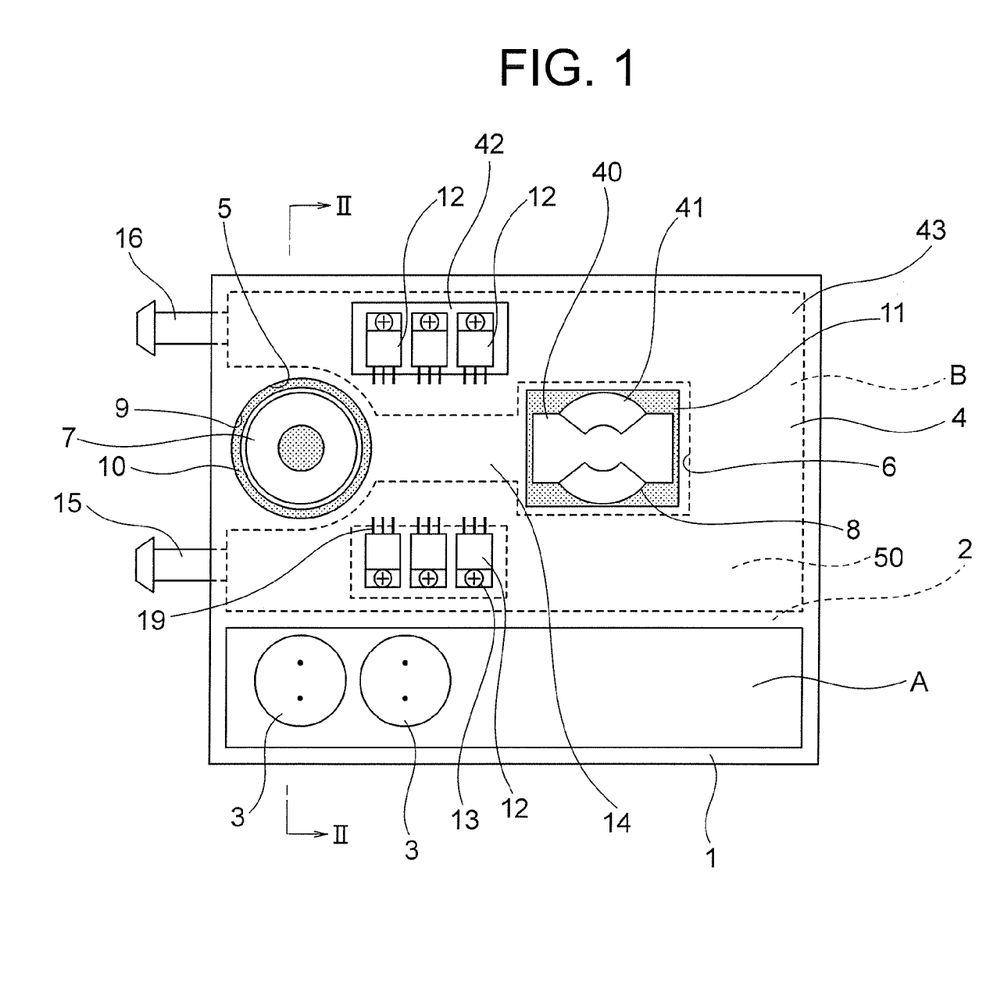
FIG. 1 is a horizontal sectional view illustrating a principal part of an in-vehicle power converter according to a first embodiment of the present invention.
Figure 2:
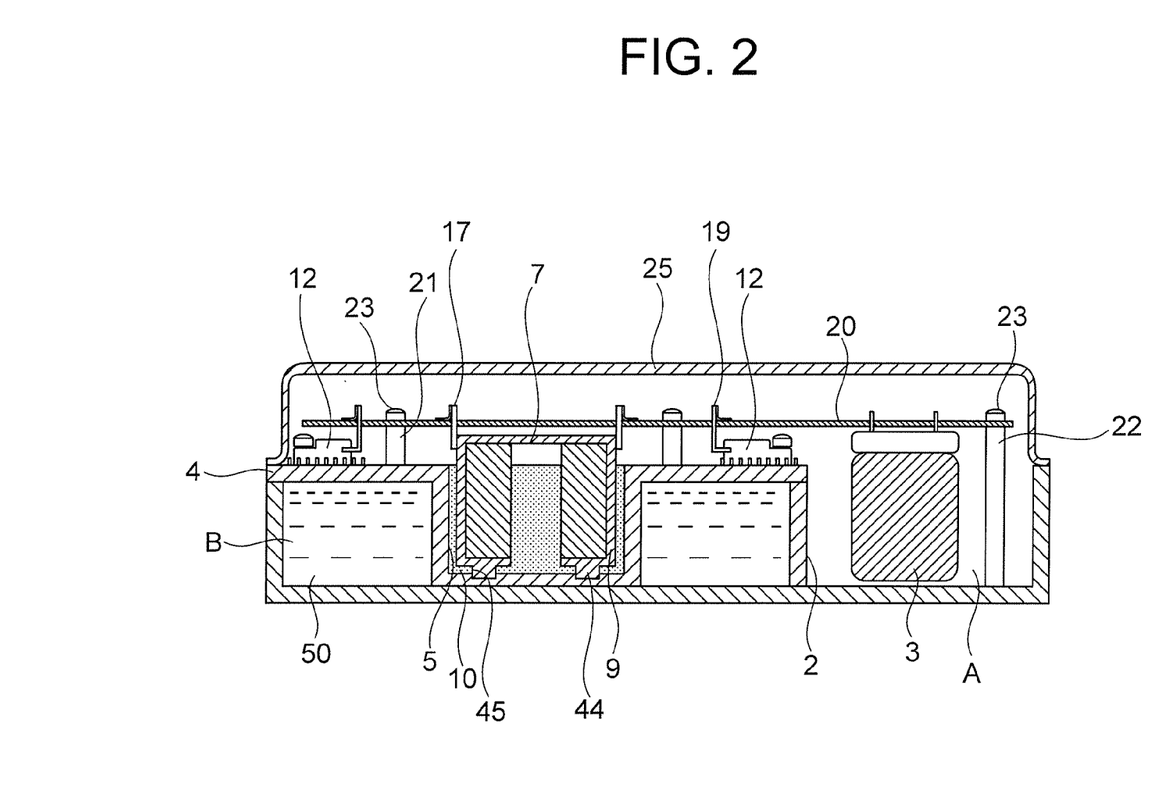
FIG. 2 is a sectional view of the power converter taken along the line II-II as viewed from the direction of the arrows
Figure 3:
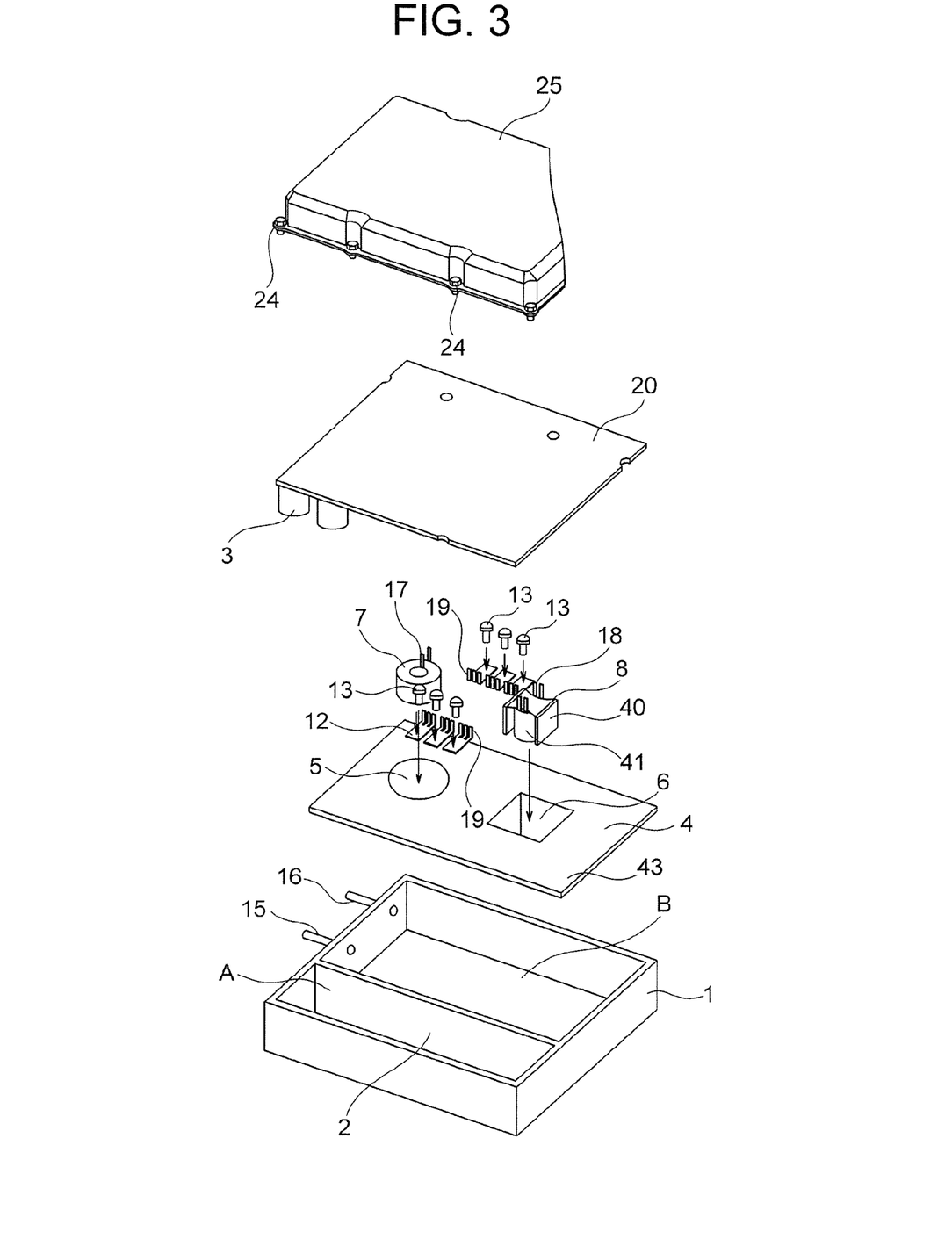
FIG. 3 is an exploded sectional view illustrating the power converter illustrated in FIG. 1.

FIG. 1 is a horizontal sectional view illustrating a principal part (lower side of a circuit board 20) of an in-vehicle power converter (hereinafter referred to as "power converter") according to a first embodiment of the present invention, FIG. 2 is a sectional view of the power converter including the circuit board 20 and a cover 25 provided to the part illustrated in FIG. 1, taken along the line II-II as viewed from the direction of the arrows, and FIG. 3 is an exploded sectional view illustrating the power converter illustrated in FIG. 1.

The power converter of the present invention is to be mounted in a plug-in hybrid vehicle, an electric automobile, and the like, and is a power converter such as an electric charger for converting an AC input power supply into a DC to charge a high-voltage battery or a DC-DC converter for converting a voltage of a high-voltage battery into a 12V-system voltage to charge an auxiliary battery.

In the power converter, the interior of a case 1 made of aluminum having an open upper side, which is a second metal member, is divided into two by a first wall 2. In a first space A, which is one of spaces partitioned by the first wall 2, capacitors 3 are housed. A second space B, which is another of the spaces, is covered with a lid 4 made of aluminum, which is a first metal member, thereby forming a hermetically-sealed space.

A first concave portion 5 and a second concave portion 6 are formed on the lid 4 so as to be separated away from each other. In the first concave portion 5, a reactor main body 7, which is a heating electric component main body, is housed. In the second concave portion 6, a transformer main body 8 including a core 40 and a coil 41, which is a heating electric component main body, is housed.

The first concave portion 5 is filled with an insulating resin 10, which is a resin such as silicon so as to fix the reactor main body 7 therein.

The reactor main body 7 is held by a resin holder 9. In addition, leg portions 44 of the resin holder 9 are fitted into groove portions 45 of the lid 4 to position the reactor main body 7 in the center of the first concave portion 5.

The transformer main body 8 provided in the second concave portion 6 is positioned in the center of the second concave portion 6 by a resin holder (not shown), and is also fixed with an insulating resin 11 which is a resin such as silicon filled in the second concave portion 6.

On a plane 43 of the lid 4, a plurality of semiconductor components 12, each performing a high-frequency switching operation, are provided between the first concave portion 5 and the second concave portion 6 so as to be opposed to each other and are fixed by fixation screws 13 through heat-radiating sheets 42.

On a back surface side of the lid 4, a second wall 14 which connects the first concave portion 5 and the second concave portion 6 to each other is formed. By the second wall 14, a U-like coolant passage 50 is formed in the second space B.

A distal end portion of an inlet pipe 15 penetrates through a side surface of the case 1. Through the inlet pipe 15, ethylene glycol, which is a coolant, is allowed to flow into the second space B. A distal end portion of an outlet pipe 16 also penetrates through the side surface of the case 1. Through the outlet pipe 16, the ethylene glycol in the second spaces B flows outside.

Distal end portions of reactor terminals 17 of the reactor main body 7, transformer terminals 18 of the transformer main body 8, and semiconductor terminals 19 of the semiconductor components 12 extend in a direction perpendicular to the plane 43 of the lid 4, and are inserted into the circuit board 20 from the back surface side to be bonded by soldering, laser welding, or the like.

The circuit board 20 is fixed by fixation screws 23 to a first boss 21, which is provided to extend from a surface of the lid 4 in the vertical direction, and to a second boss 22, which is provided to extend from a surface of the case 1 in the vertical direction, as illustrated in FIG. 2. In FIGS. 1 and 3, the first boss 21 and the second boss 22 are omitted.

Above the circuit board 20, the cover 25 is provided. The cover 25 is fixed to the case 1 and the lid 4 by fixation screws 24 provided in a peripheral edge portion.

In the power converter, the pair of the first concave portion 5 and the second concave portion 6 projecting into the second space B is formed on the lid 4 which is the first metal member. The reactor main body 7, which is the heating electric component main body, is housed within the first concave portion 5, whereas the transformer main body 8, which is the heating electric component main body, is housed within the second concave portion 6.

The ethylene glycol, which is the coolant, flows into the second space B through the inlet pipe 15, passes through the coolant passage 50, and then flows out thereof through the outlet pipe 16.

Therefore, the reactor main body 7 and the transformer main body 8 are surrounded by the ethylene glycol through the concave portions 5 and 6 of the lid 4 made of aluminum having a high thermal conductivity provided therearound. Therefore, a sufficiently large heat-radiating area is ensured. In addition, the ethylene glycol is flowing, and hence heat transfer is increased. Therefore, the heat is radiated efficiently.

Moreover, the reactor main body 7 provided in the first concave portion 5 and the transformer main body 8 provided in the second concave portion 6 are easily fixed respectively with the insulating resins 10 and 11 filled in the concave portions. In addition, parts of the lid 4 also serve as the reservoirs of the reactor and the transformer, which house the reactor main body 7 and the transformer main body 8 therein. Therefore, the number of components is reduced. At the same time, the heat-transfer path between the ethylene glycol, and the reactor main body 7 and the transformer main body 8 is shortened to reduce the heat resistance value.

Moreover, on the plane 43 of the lid 4 on the surface side, which includes the first concave portion 5 and the second concave portion 6, the plurality of semiconductor components 12, each performing the high-frequency switching operation, are mounted. Therefore, the area of the circuit board 20, on which the electric components are mounted, can be correspondingly reduced.

Moreover, the second space B is present on the back side of the lid 4 on which the semiconductor components 12 are mounted. The heat of the semiconductor components 12 is efficiently radiated through the ethylene glycol flowing within the second space B. Therefore, thermal interference with other electric components provided on the circuit board 20 can be further suppressed. As a result, the power converter can be reduced in size.

Further, the reactor main body 7 provided in the first concave portion 5 and the transformer main body 8 provided in the second concave portion 6 are easily positioned in the center of the concave portion 5 and the center of the concave portion 6 by the resin holders 9. Therefore, workability in assembly is improved.

Further, the distal end portions of the reactor terminals 17 of the reactor main body 7, the transformer terminals 18 of the transformer main body 8, and the semiconductor terminals 19 of the semiconductor components 12 extend from the plane 43 of the lid 4 in the vertical direction. Therefore, ease of assembly to the circuit board 20 and reliability in assembly are improved.

Moreover, by directly assembling the reactor terminals 17 of the reactor main body 7, the transformer terminals 18 of the transformer main body 8, and the semiconductor terminals 19 of the semiconductor components 12 onto the circuit board 20, the number of components can be reduced, while a distance of a wiring through which a high current flows can be minimized.

In the manner described above, the effects of heat loss and electric noise generated at the time of high-frequency drive on the circuit board 20 can be reduced.

Further, a direction in which the reactor main body 7 is embedded in the first concave portion 5 of the lid 4 and a direction in which the transformer main body 8 is embedded in the second concave portion 6 of the lid 4 are the same as a direction in which the semiconductor components 12 are mounted on the plane 43 of the lid 4. Therefore, in cooperation with the resin holder 9 provided to the reactor main body 7 and the resin holder (not shown) provided to the transformer main body 8, the positioning with respect to the circuit board 20 is facilitated.

In the above-mentioned manner, the ease of assembly is improved.

Further, in the second space B, the first concave portion 5 and the second concave portion 6 are connected to each other by the second wall 14. The ethylene glycol flows into the inlet pipe 15 and flows out through the outlet pipe 16. The reactor main body 7 embedded in the first concave portion 5 and the transformer main body 8 embedded in the second concave portion 6 are reliably cooled by the ethylene glycol flowing through an outgoing path and a return path.

Second Embodiment

Figure 4:
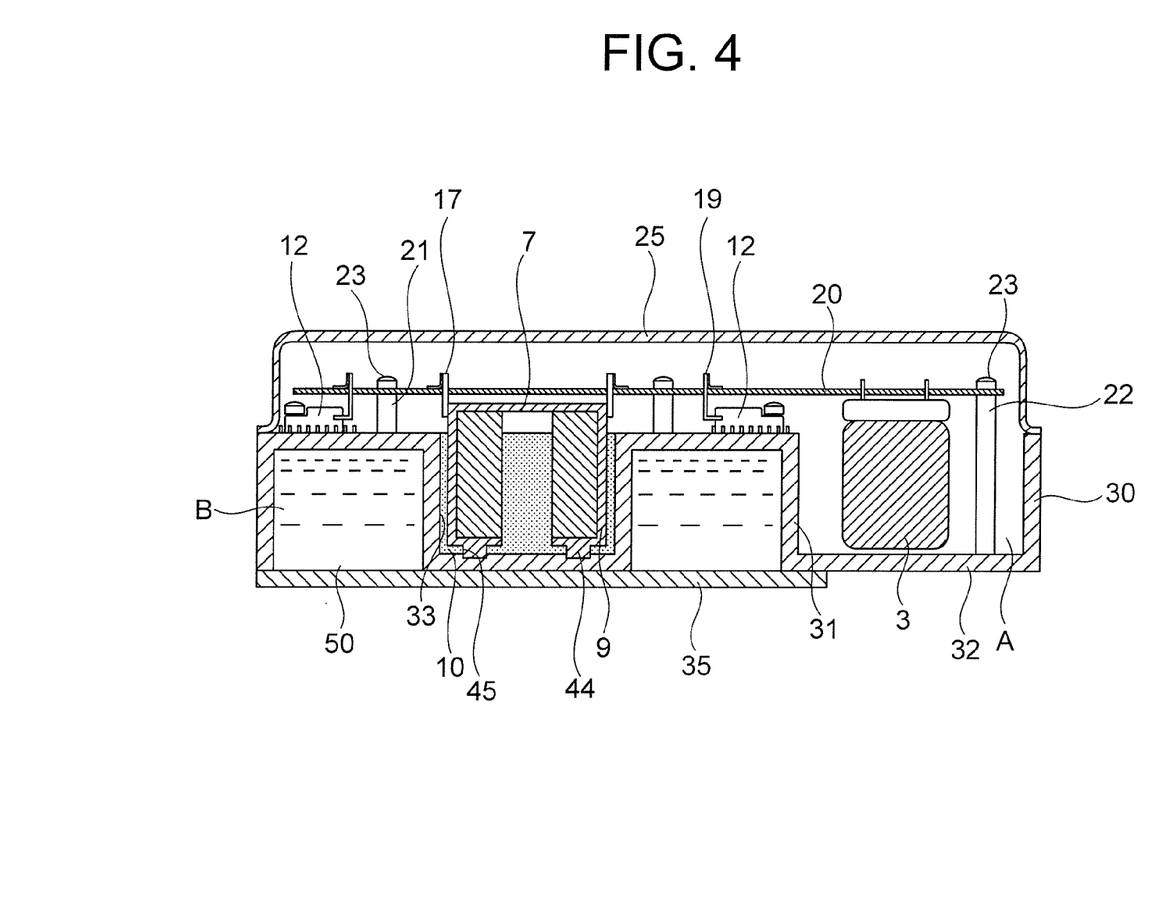
FIG. 4 is a side sectional view illustrating a power converter according to a second embodiment of the present invention.
Figure 5:
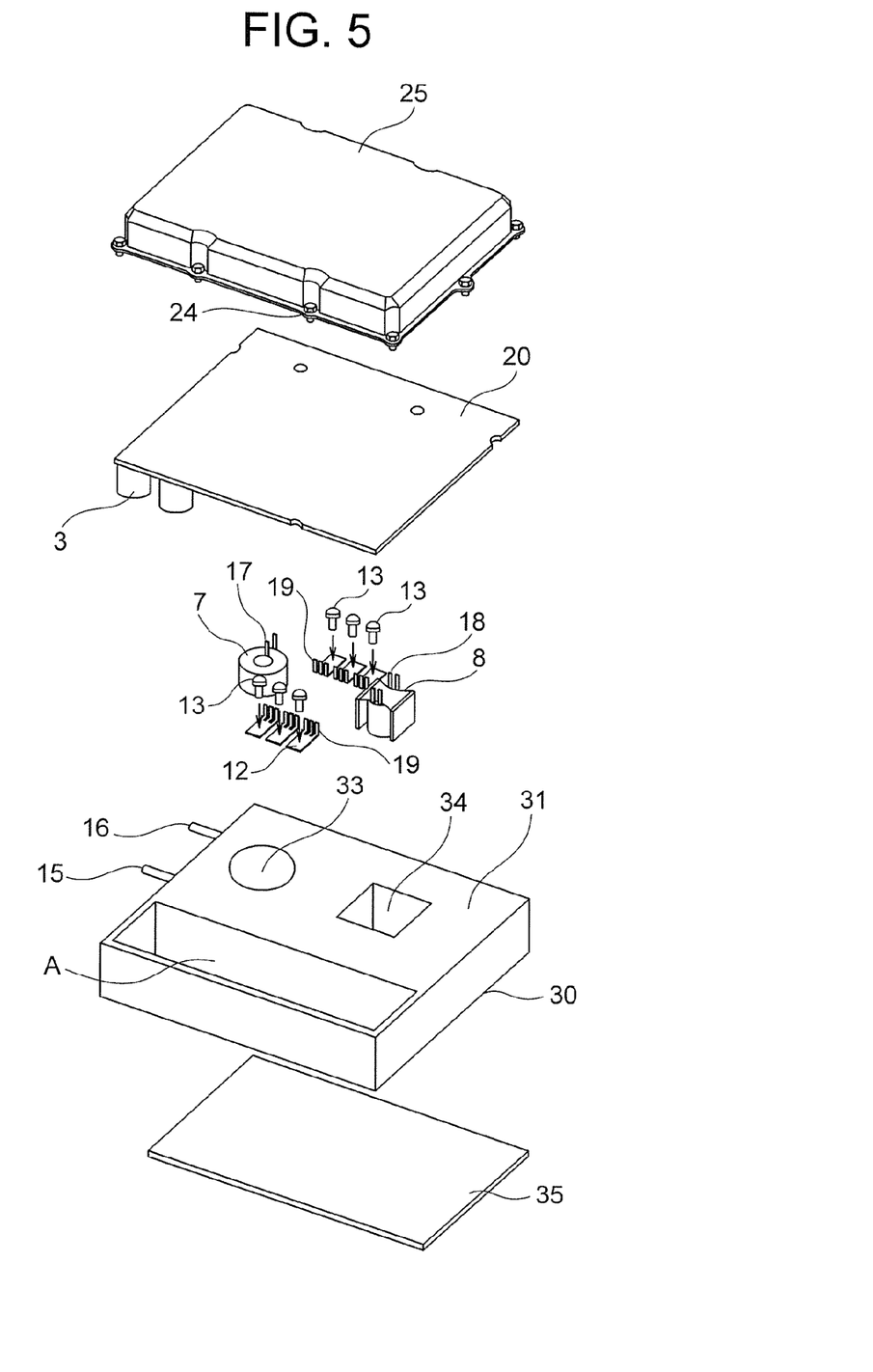
FIG. 5 is an exploded perspective view of FIG. 4.

FIG. 4 is a side sectional view illustrating a power converter according to a second embodiment of the present invention, and FIG. 5 is an exploded perspective view of FIG. 4.

In the power converter of the present invention, a case 30 made of aluminum, which is the first metal member, includes a bottom portion 32 above which the capacitors 3 are housed in the first space A and a projecting portion 31 which projects upward. An aperture of the projecting portion 31 of the case 30 is covered with a lid 25 made of aluminum, which is the second metal member. The second space B inside the projecting portion 31 is hermetically-sealed by the lid 35.

On the projecting portion 31, a first concave portion 33 and a second concave portion 34 are formed so as to be separated away from each other. In the first concave portion 33, the reactor main body 7 is housed. In the second concave portion 34, the transformer main body 8 including the core 40 and the coil 41 is housed.

The reactor main body 7 provided in the first concave portion 33 is positioned in the center of the first concave portion 33 by the resin holder 9, and is fixed with the insulating resin 10 filled in the first concave portion 33.

The transformer main body 8 provided in the second concave portion 34 is positioned in the center of the second concave portion 34 by the resin holder (not shown), and is fixed with the insulating resin filled in the second concave portion 34.

The plurality of semiconductor components 12 are fixed onto a surface of the projecting portion 31 of the case 30 by the fixation screws 13 through heat-radiating sheets (not shown).

In the second space B inside the projecting portion 31, a wall (not shown) which connects the first concave portion 33 and the second concave portion 34 is formed. By the wall, the U-like coolant passage 50 is formed in the second space B inside the projecting portion 31.

The remaining configuration is the same as that of the power converter of the first embodiment.

In the embodiments described above, the respective outer peripheries of the reactor main body 7 and the transformer main body 8 are surrounded by the second space B in which the ethylene glycol corresponding to the coolant flows. Therefore, a large heat-radiating area can be ensured for the reactor main body 7 and the transformer main body 8.

Moreover, the semiconductor components 12 are mounted on the plane 43 on the surface side, on which the first concave portion 33 and the second concave portion 34 are formed. The heat of the semiconductor components 12 is transferred to the ethylene glycol through the heat-radiating sheets and the plane 43 of the case 30 so as to be radiated therefrom. As a result, performance for radiating heat of the semiconductor components 12 is improved.

The semiconductor components 12, the reactor main body 7, the transformer main body 8, and the capacitors 3 are provided in the spaces closed by the case 30 and the cover 25. The ethylene glycol in the second space B is closed by the lid 35 provided outside of the case 30. Therefore, even when the ethylene glycol in the second space B leaks out from a portion at which the case 30 and the lid 35 are connected, the ethylene glycol does not flow into the interior of the power converter.

Thus, the ethylene glycol is prevented from adhering to the semiconductor components 12, the reactor main body 7, the transformer main body 8, the capacitors 3, and the like so as to avoid the occurrence of inconvenience such as a short-circuit, a conductor failure, and the like.

Although the ethylene glycol is used as the coolant, the ethylene glycol is merely an example. As the coolant, for example, air may be used.

Moreover, although the coolant passage 50 is a U-shaped path provided inside the second space B, the coolant passage may be an I-shaped passage in which the coolant flows unidirectionally.

REFERENCE SIGNS LIST 1 case (second metal member), 2 first wall, 3 capacitor, 4 lid (first metal member), 5, 33 first concave portion, 6, 34 second concave portion, 7 reactor main body, 8 transformer main body, 9 resin holder, 10, 11 insulating resin, 12 semiconductor component, 13, 23, 24 fixation screw, 14 second wall, 15 inlet pipe, 16 outlet pipe, 17 reactor terminal, 18 transformer terminal, 19 semiconductor terminal, 20 circuit board, 21, 22 boss, 25 cover, 30 case (first metal member), 31 projecting portion, 32 bottom portion, 35 lid (second metal member), 40 core, 41 coil, 42 heat-radiating sheet, 43 plane, 44 leg portion, 45 groove portion, 50 coolant passage, A first space, B second space

The invention claimed is:
1. A power converter, comprising:
a first metal member;
a second metal member connected to the first metal member, wherein only two sections are formed within the second metal member so that the sections are separated away from each other, and a coolant only flows in one of the two separated sections; and
at least one heating electric component main body to be respectively housed in at least one concave portion formed on the first metal member so as to project into a space provided between the first and second metal members through which the coolant flows, the space surrounded only by the first and second metal members.

2. The power converter according to claim 1, further comprising a semiconductor component for performing a high-frequency switching operation, the semiconductor component being mounted on a plane of the first metal member having the concave portion formed thereon.

3. The power converter according to claim 2, wherein distal end portions of terminals of the at least one heating electric component main body and the semiconductor component extend in a direction perpendicular to the plane.

4. The power converter according to claim 3, further comprising a circuit board provided so as to be opposed to the plane, wherein the terminals are electrically connected to the circuit board.

5. The power converter according to claim 1, wherein the at least one heating electric component main body is fixed inside the at least one concave portion with an insulating resin filled in the at least one concave portion.

6. The power converter according to claim 1, wherein the at least one heating electric component main body is positioned in a center of the at least one concave portion by a resin holder for holding the at least one heating electric component main body.

7. The power converter according to claim 1,
wherein the at least one concave portion comprises a pair of concave portions formed so that the concave portions are separated away from each other,
wherein the concave portions are connected by a wall which forms a portion of an outgoing path and a portion of a return path for the coolant, and
wherein the coolant flowing into an inlet pipe in communication with the space passes through the outgoing path and the return path to flow outside through an outlet pipe in communication with the space.

8. The power converter according to claim 7,
wherein the power converter comprises an in-vehicle power converter, and
wherein the at least one heating electric component main body comprises a reactor main body and a transformer main body, the heating electric component main body being housed in one of the concave portions and the transformer main body being housed in another of the concave portions.

* * * * *